(12) United States Patent
Muramatsu et al.

(10) Patent No.: US 12,145,381 B2
(45) Date of Patent: Nov. 19, 2024

(54) PRINTER INCLUDING SWITCH UNIT POSITIONED IN GROOVE OF CASING WITH FPC CONNECTED TO CONTROLLER THROUGH HOLE OF GROOVE

(71) Applicant: BROTHER KOGYO KABUSHIKI KAISHA, Nagoya (JP)

(72) Inventors: Tetsuro Muramatsu, Nagoya (JP); Masashi Tanizaki, Kuwana (JP); Koshiro Shimoda, Tokoname (JP); Yuya Nakamura, Toyoake (JP)

(73) Assignee: BROTHER KOGYO KABUSHIKI KAISHA, Nagoya (JP)

( * ) Notice: Subject to any disclaimer, the term of this patent is extended or adjusted under 35 U.S.C. 154(b) by 217 days.

(21) Appl. No.: 18/047,870

(22) Filed: Oct. 19, 2022

(65) Prior Publication Data

US 2023/0131978 A1    Apr. 27, 2023

(30) Foreign Application Priority Data

Oct. 25, 2021    (JP) .................................. 2021-173980

(51) Int. Cl.
| | | |
|---|---|---|
| *B41J 29/02* | (2006.01) | |
| *B41J 29/13* | (2006.01) | |
| *B41J 29/38* | (2006.01) | |
| *H05K 1/02* | (2006.01) | |

(52) U.S. Cl.
CPC .............. *B41J 29/02* (2013.01); *B41J 29/13* (2013.01); *B41J 29/38* (2013.01); *H05K 1/028* (2013.01)

(58) Field of Classification Search
CPC . B41J 29/02; B41J 29/13; B41J 29/38; H05K 1/028
See application file for complete search history.

(56) References Cited

U.S. PATENT DOCUMENTS

2017/0213061 A1*   7/2017  Takahashi ............ H04N 1/0083

FOREIGN PATENT DOCUMENTS

JP          2012-223923 A        11/2012

* cited by examiner

*Primary Examiner* — Geoffrey S Mruk
(74) *Attorney, Agent, or Firm* — KENEALY VAIDYA LLP (57) ABSTRACT

A printer includes: a casing; a grooved part recessed from an outer surface of the casing; a switch unit provided in the grooved part; a controller inside the casing; an FPC connecting the switch unit to the controller; and a hole part formed at a prescribed end portion of a bottom surface of the grooved part. A bottom surface of the switch unit is fixed to the groove bottom surface through the FPC. The hole part is aligned with a center of the groove bottom surface in a prescribed direction. The hole part defines a first inner end and a second inner end opposing each other in the prescribed direction, the first inner end being farther away from the center of the groove bottom surface than the second inner end is in the prescribed direction. The first inner end is positioned outside of the grooved part in the prescribed direction.

8 Claims, 8 Drawing Sheets

PRINTER INCLUDING SWITCH UNIT POSITIONED IN GROOVE OF CASING WITH FPC CONNECTED TO CONTROLLER THROUGH HOLE OF GROOVE

REFERENCE TO RELATED APPLICATIONS

This application claims priority from Japanese Patent Application No. 2021-173980 filed on Oct. 25, 2021. The entire content of the priority application is incorporated herein by reference.

BACKGROUND ART

There has been known a conventional printer which is constituted by assembling a housing and a chassis assembly to each other. The housing has a substantially rectangular parallelepiped shape elongated in a left-right direction. The housing includes a top cover, a lower cover, and a cover member.

DESCRIPTION

The above-described printer may be provided with a membrane switch at the top cover. The membrane switch is a thin sheet-like switch configured by printing circuits and contacts on films and stacking the films. The top cover is formed with a grooved part in which the membrane switch is disposed. The grooved part is a recess that is recessed on an outer surface of the top cover. In the grooved part, a hole is formed to penetrate through the top cover. The membrane switch is connected to an FPC (Flexible Printed Circuit). The membrane switch is fixed to the bottom of the grooved part through the FPC. The FPC has one end connected to the membrane switch and inserted through the hole of the grooved part.

There may be a case where the membrane switch is fixed to the bottom of the grooved part with the FPC bent by 180 degrees at the grooved part. When a user operates the membrane switch while the FPC is bent in this way, conceivably, user's operational feeing of the membrane switch may be deteriorated, or disconnection of the FPC may occur.

In view of the foregoing, it is an object of the present disclosure to provide a printer capable of suppressing the FPC from being assembled in a bent state.

In order to attain the above and other object, the present disclosure provides a printer including a casing, a grooved part, a switch unit, a controller, a flexible printed circuit, and a hole part. The grooved part is in a form of a recess formed on an outer surface of the casing. The grooved part has a groove bottom surface and a groove inner wall. The groove bottom surface has a prescribed end portion from which the groove inner wall extends. The switch unit is provided in the grooved part. The switch unit has a switch bottom surface. The controller is disposed inside the casing. The flexible printed circuit has a first end connected to the switch bottom surface and a second end connected to the controller. The hole part is formed at the prescribed end portion of the groove bottom surface. The flexible printed circuit extends through the hole part to be introduced inside the casing. The groove bottom surface defines a center thereof in a prescribed direction. The center and the hole part are aligned with each other in the prescribed direction. The hole part has inner walls defining a first inner end and a second inner end opposing each other in the prescribed direction. The first inner end is farther away from the center of the groove bottom surface than the second inner end is from the center of the groove bottom surface in the prescribed direction. The switch bottom surface is fixed to the groove bottom surface through the flexible printed circuit. The first inner end is positioned outside of the grooved part in the prescribed direction or at the same position as the groove inner wall in the prescribed direction.

In this printer, the flexible printed circuit (FPC) extends through the hole part and is introduced into the casing. The hole part is formed at the prescribed end portion of the groove bottom surface in the prescribed direction. With respect to the prescribed direction, the first inner end of the hole part is positioned outside of the grooved part or at the same position as the groove inner wall. With the above structure, the switch unit is less likely to be assembled to the grooved part of the casing in a state where the FPC is folded or bent by 180 degrees.

OVERVIEW OF PRINTER 1

A printer 1 according to an embodiment of the present disclosure will be described with reference to accompanying drawings.

Figure 1:
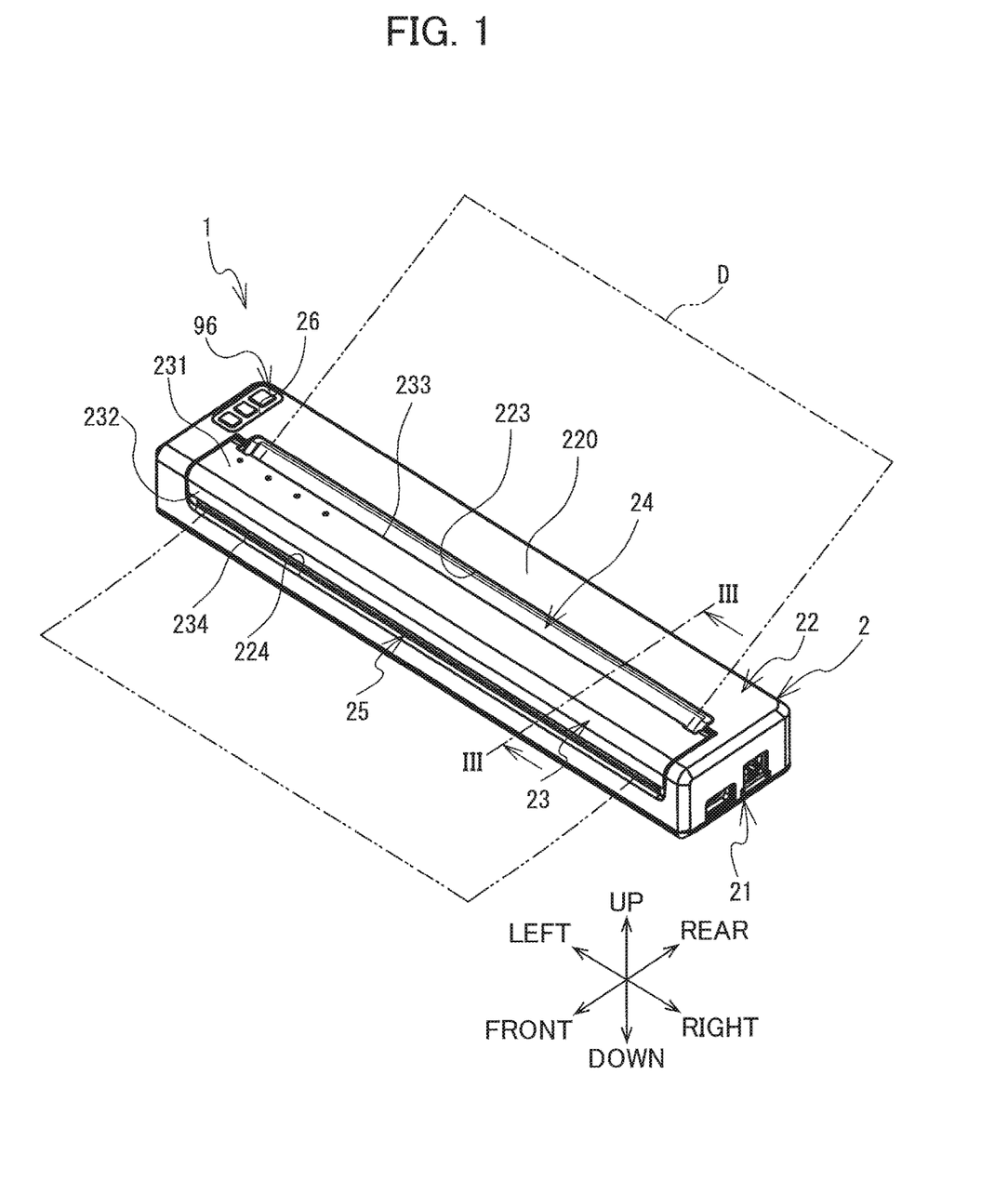
FIG. 1 is a perspective view of a printer 1 according to one embodiment.

In the following description, the lower-left side, upper-right side, upper-left side, lower-right side, upper side, and lower side in FIG. 1 will be defined as a front side, a rear side, a left side, a right side, an upper side, and a lower side of the printer 1, respectively.

The printer 1 is configured to form an image on a medium D based on print data. The medium D is not limited to a specific medium, and may be a sheet-like or tape-like medium. In the present embodiment, heat-sensitive cut paper is employed as the medium D.

Figure 2:
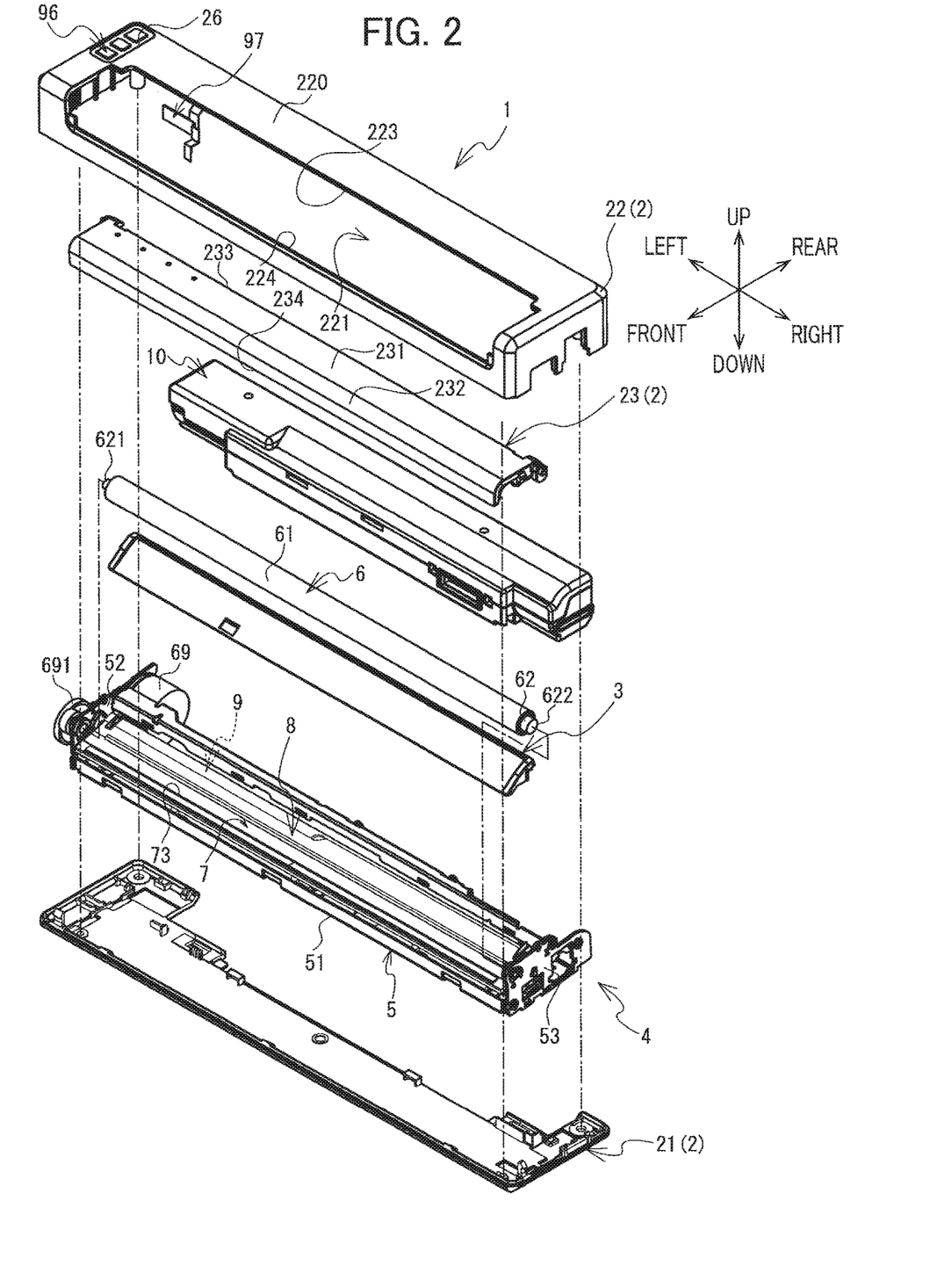
FIG. 2 is an exploded perspective view of the printer 1.

The printer 1 includes a casing 2. The casing 2 has a rectangular parallelepiped shape whose dimension in a left-right direction is greater than dimensions thereof in a front-rear direction and an up-down direction. A battery 10 illustrated in FIG. 2 is attachable to a lower-rear portion of the casing 2. The battery 10 is configured to supply power to the printer 1 when attached to the printer 1.

As illustrated in FIG. 2, the casing 2 includes a lower cover 21, an upper cover 22, and an open-close cover 23. The lower cover 21 has a plate-like shape and extends in the front-rear direction and in the left-right direction. The lower cover 21 constitutes a bottom of the casing 2.

The upper cover 22 opens downward and is assembled to the lower cover 21 from above. A grooved part 26 is formed on an upper surface 220 of the upper cover 22 in a region adjacent to a left end portion thereof. The grooved part 26 is a part recessed downward from the upper surface 220. A switch unit 96 is arranged in the grooved part 26. The switch unit 96 will be described in detail later.

The upper cover 22 is formed with an opening 221. The opening 221 is open on a front surface and on the upper surface 220 of the upper cover 22. Specifically, with respect to the up-down direction, the opening 221 extends from a center portion to an upper end of the front surface of the upper cover 22. With respect to the front-rear direction, the opening 221 extends from a front end to a center portion of the upper surface 220 of the upper cover 22. Further, with respect to the left-right direction, the opening 221 extends from a position near a left end to a position near a right end of the upper cover 22. Hereinafter, in the upper cover 22, an end defining a rear end of the opening 221 will be referred to as "opening edge 223", and an end defining a bottom end of the opening 221 will be referred to as "opening edge 224".

The open-close cover 23 is plate shaped and has a first portion 231 and a second portion 232. The first portion 231 extends in the front-rear direction and in the left-right direction. The second portion 232 extends downward from a front end of the first portion 231 and also extends in the left-right direction. The open-close cover 23 is configured to be fitted in the opening 221 of the upper cover 22. The first portion 231 has a rear end 223 that is rotatably supported by the upper cover 22. Accordingly, the open-close cover 23 is pivotable about the rear end 223 of the first portion 231 as a fulcrum, such that the open-close cover 23 can open and close the opening 221.

Hereinafter, the description will be made based on a state illustrated in FIG. 1 where the open-close cover 23 closes the opening 221. In the closed state of the open-close cover 23, the rear end 233 of the first portion 231 faces the opening edge 223 of the opening 221 in the upper cover 22 with a gap therebetween in the front-rear direction. Further, a lower end 234 of the second portion 232 faces the opening edge 224 of the opening 221 in the upper cover 22 with a gap therebetween in the up-down direction.

An insertion slot 24 is formed in an upper surface of the casing 2. The insertion slot 24 is an opening defined by the opening edge 223 of the upper cover 22 and the rear end 233 of the open-close cover 23. The medium D is configured to be supplied inside the casing 2 through the insertion slot 24.

A discharge slot 25 is formed in a front surface of the casing 2. The discharge slot 25 is an opening defined by the opening edge 224 of the upper cover 22 and the lower end 234 of the open-close cover 23. After printing is performed on the medium D inside the casing 2, the medium D is configured to be discharged outside the casing 2 through the discharge slot 25.

Figure 3:
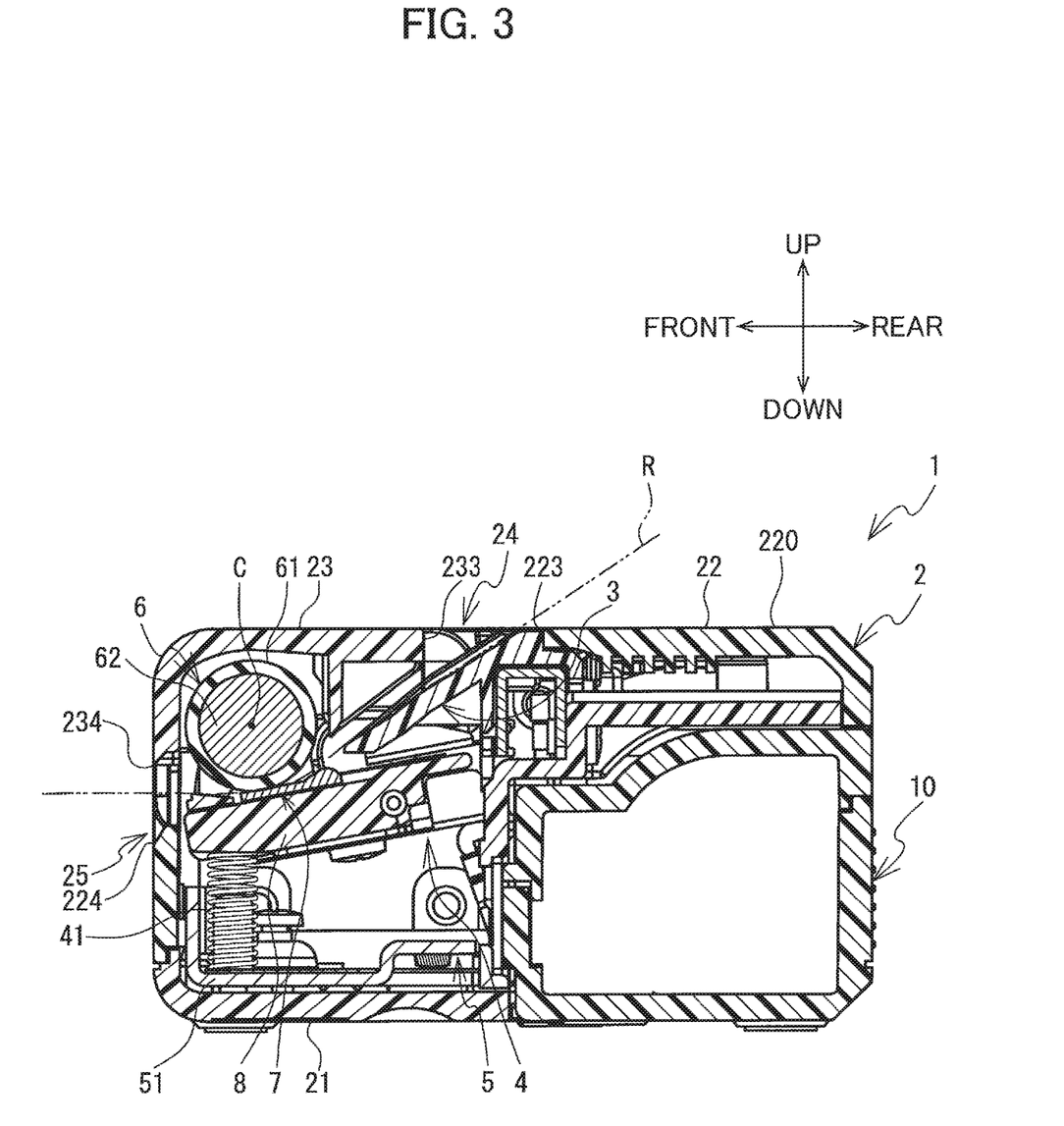
FIG. 3 is a cross-sectional view of the printer 1 taken along a line III-III shown in FIG. 1.

As illustrated in FIGS. 2 and 3, the printer 1 includes a head unit 4 housed inside the casing 2. The head unit 4 includes a support frame 5, a platen roller 6, a thermal head 7, and a heat sink 8.

The support frame 5 includes a lower plate 51, a left plate 52, and a right plate 53. The lower plate 51 has a rectangular shape in a plan view and is elongated more in the left-right direction than in the front-rear direction. The lower plate 51 is fixed to an upper surface of the lower cover 21. The left plate 52 extends upward from a left end of the lower plate 51 and also extends in the front-rear direction. The right plate 53 extends upward from a right end of the lower plate 51 and also extends in the front-rear direction. The left plate 52 and right plate 53 oppose each other in the left-right direction.

The platen roller 6 is provided at an upper-front region inside the casing 2 (see FIG. 3). The platen roller 6 extends in the left-right direction. The platen roller 6 includes a cylinder part 61 and a shaft 62. The cylinder part 61 is an elastic body such as rubber. The shaft 62 penetrates through the cylinder part 61 and is fixed thereto. The shaft 62 has a left end 621 supported by the left plate 52. The shaft 62 has a right end 622 supported by the right plate 53. The platen roller 6 is rotatable about an axis C of the shaft 62.

The platen roller 6 is coupled to a motor 69 through a gear 691 and the like. The motor 69 is fixed to a right surface of the left plate 52 at a lower-rear portion thereof. The gear 691 is supported by the left plate 52 on a left side thereof. The platen roller 6 is rotatable upon receipt of a driving force of the motor 69 through the gear 691.

A controller 9 is provided at a lower portion of the head unit 4 such that the controller 9 is positioned rightward of the motor 69. The controller 9 is configured to control operations of the printer 1. The controller 9 is connected to the switch unit 96 (described later) through a flexible printed circuit (FPC) 97. The controller 9 is also electrically connected to the motor 69 and thermal head 7.

Referring to FIG. 3, the axis C of shaft 62 serves as a rotation center C of the platen roller 6. The axis C (rotation center C) passes through a center of the shaft 62 and extends in the left-right direction. The platen roller 6 is rotatable about the rotation center C to convey the medium D in a conveying direction. The conveying direction is a direction in which the medium D is configured to be conveyed by the platen roller 6 and is orthogonal to the left-right direction in the present embodiment.

The thermal head 7 is disposed below the platen roller 6. As the medium D is conveyed by the rotation of the platen roller 6 in the conveying direction, the thermal head 7 moves relative to the medium D in the conveying direction. As illustrated in FIG. 2, the thermal head 7 includes a plurality of heating elements 73. The plurality of heating elements 73 can generate heat when supplied with power. The plurality of heating elements 73 is configured to apply the generated heat to the medium D while making contact with the medium D which is pressed by the platen roller 6, thereby forming an image on the medium D. The controller 9 is configured to supply power to the plurality of heating elements 73 based on print data to selectively cause the heating elements 73 to generate heat.

The heat sink 8 is in contact with the thermal head 7 and supports the thermal head 7. The heat sink 8 has a plate-like shape and is configured to discharge the heat generated by the plurality of heating elements 73. A compression coil spring 41 is provided inside the casing 2. The compression coil spring 41 has an upper end in contact with a lower surface of the heat sink 8 to urge the heat sink 8 upward. The platen roller 6 is pressed against the thermal head 7 by an urging force of the compression coil spring 41.

As illustrated in FIGS. 2 and 3, a guide member 3 is provided upstream of the thermal head 7 in the conveying direction. The guide member 3 is positioned inside the casing 2 at a position below the insertion slot 24. The guide member 3 has a plate-like shape and is elongated in the left-right direction. The guide member 3 extends diagonally downward and frontward from the opening edge 223 of the upper cover 22. The guide member 3 defines a conveying path R of the medium D conveyed in the conveying direction.

<Switch Unit 96>

Figure 4:
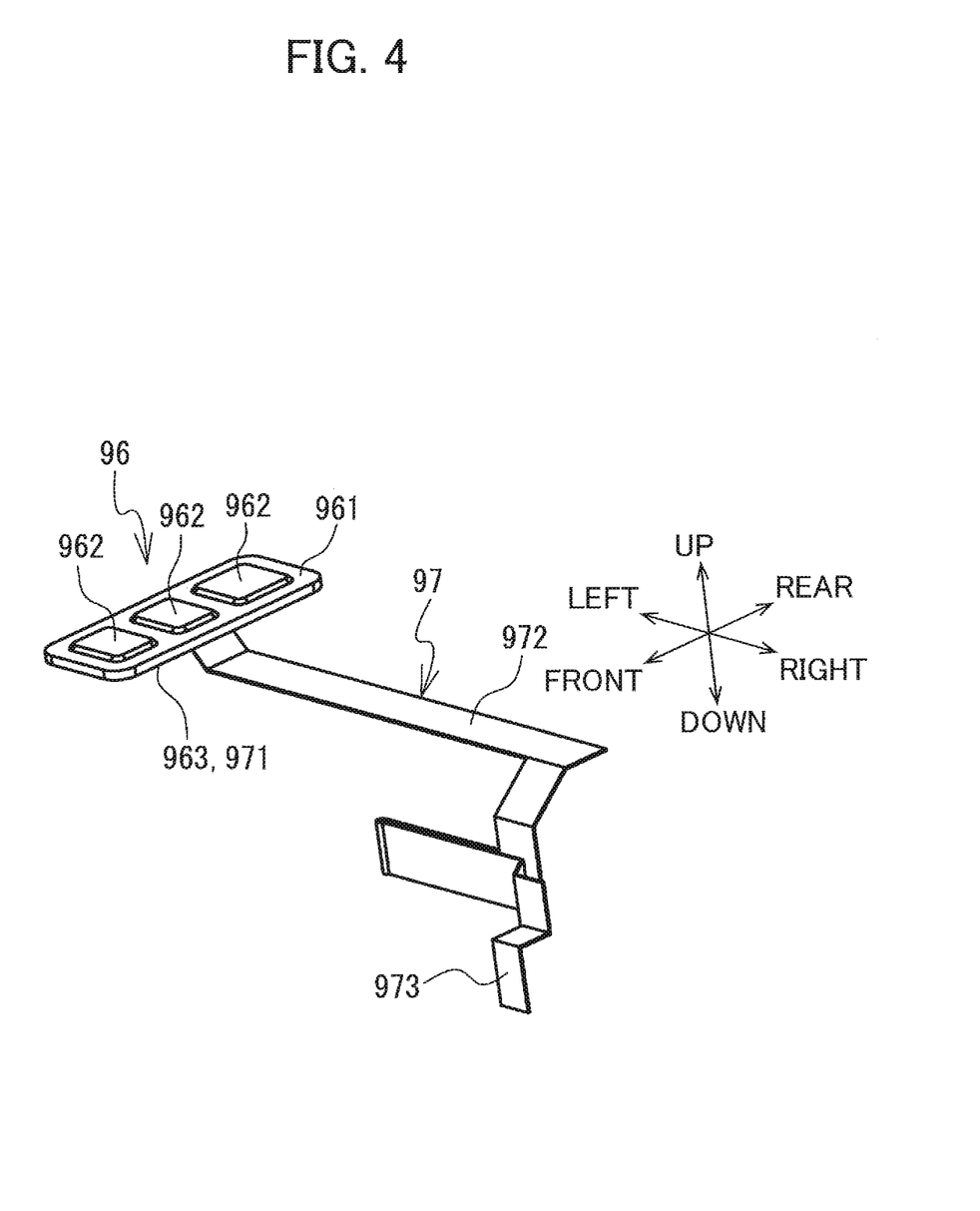
FIG. 4 is a perspective view of a switch unit 96 of the printer 1.

The switch unit 96 will be described next with reference to FIG. 4.

The switch unit 96 is a part that a user operates to input various instructions to the controller 9. The switch unit 96 includes a plate part 961 and three buttons 962. The plate part 961 has a plate-like shape extending in the front-rear and left-right directions. The plate part 961 has a rectangular shape in a plan view. The three buttons 962 are arranged in the front-rear direction on the plate part 961. The three buttons 962 are deformable. Specifically, the three buttons 962 are configured to deform downward relative to a bottom surface 963 of the plate part 961 when a user depresses the buttons 962 from above.

The switch unit 96 and controller 9 are connected to each other through the FPC 97. The FPC 97 has a switch connection part 971, a cable part 972, and a controller connection part 973. The switch connection part 971 has the same rectangular shape as the plate part 961 in a plan view. The switch connection part 971 is fixed to the bottom surface 963. Contacts are provided on the switch connection part 971 at positions corresponding to the respective three buttons 962. When any one of the three buttons 962 is dented by user's depression, the corresponding contact of the switch connection part 971 is rendered on.

The cable part 972 extends from a right end portion of the switch connection part 971. The cable part 972 has an elongated shape and has flexibility. The cable part 972 has one end connected to the switch connection part 971, and another end connected to the controller connection part 973. The controller connection part 973 is connected to the controller 9. An electric circuit is provided inside of each of the switch connection part 971, cable part 972, and controller connection part 973. When the contact of the switch connection part 971 is rendered ON, a signal indicative of the turning ON of the contact is inputted to the controller 9 through the electric circuits of the switch connection part 971, cable part 972, and controller connection part 973.

<Structure of the Upper Cover 22>

The structure of the upper cover 22 will be described next with reference to FIGS. 5 to 7.

Figure 7:
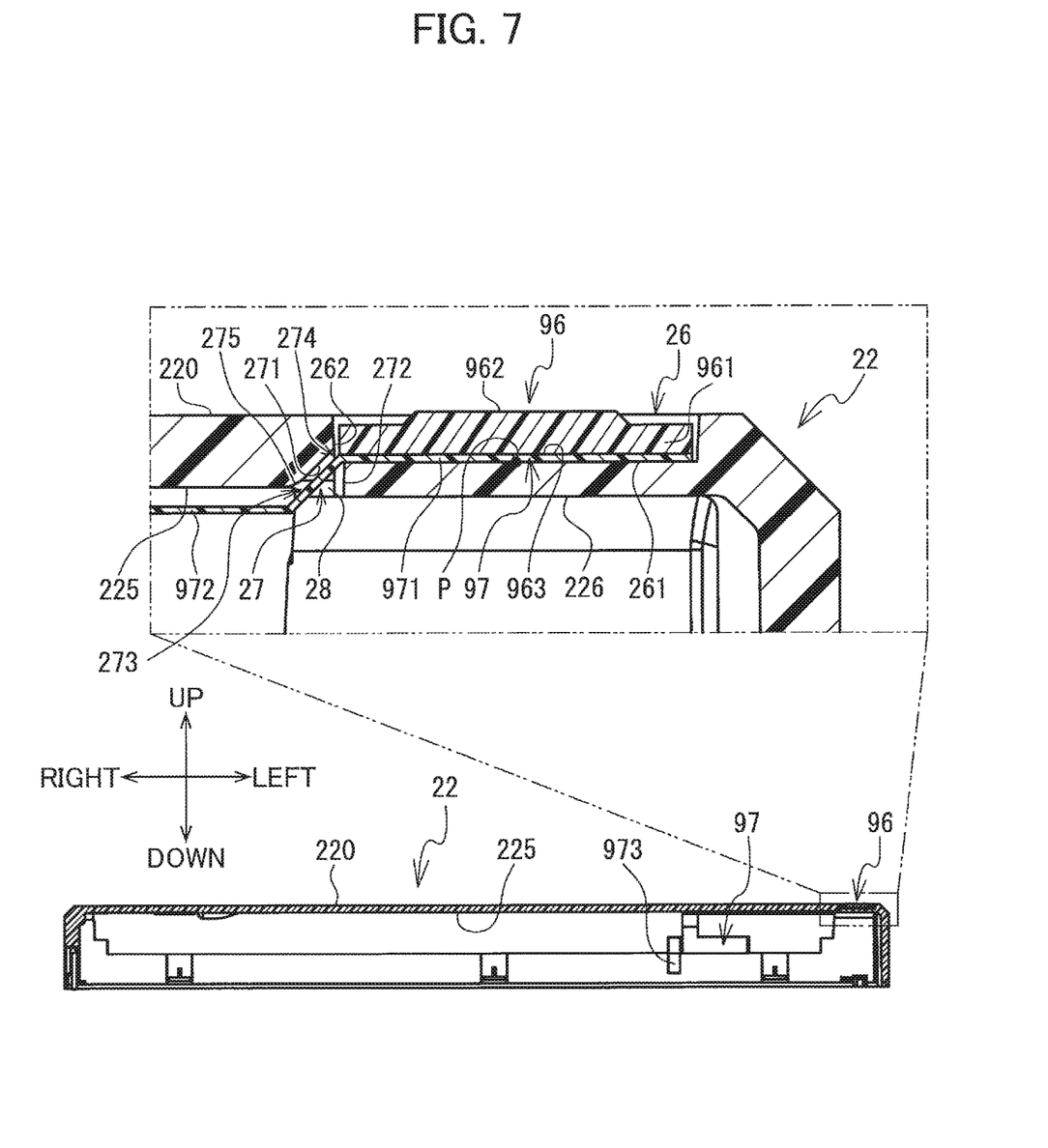
FIG. 7 is a cross-sectional view of the upper cover 22 taken along a line VII-VII shown in FIG. 6.

The switch unit 96 is fixed to a bottom surface 261 of the grooved part 26 through the switch connection part 971 (see FIG. 7). In the present embodiment, the switch unit 96 is fixed to the bottom surface 261 by a double-sided tape (not illustrated). Alternatively, the switch unit 96 may be fixed to the bottom surface 261 by, for example, an adhesive agent.

Figure 5:
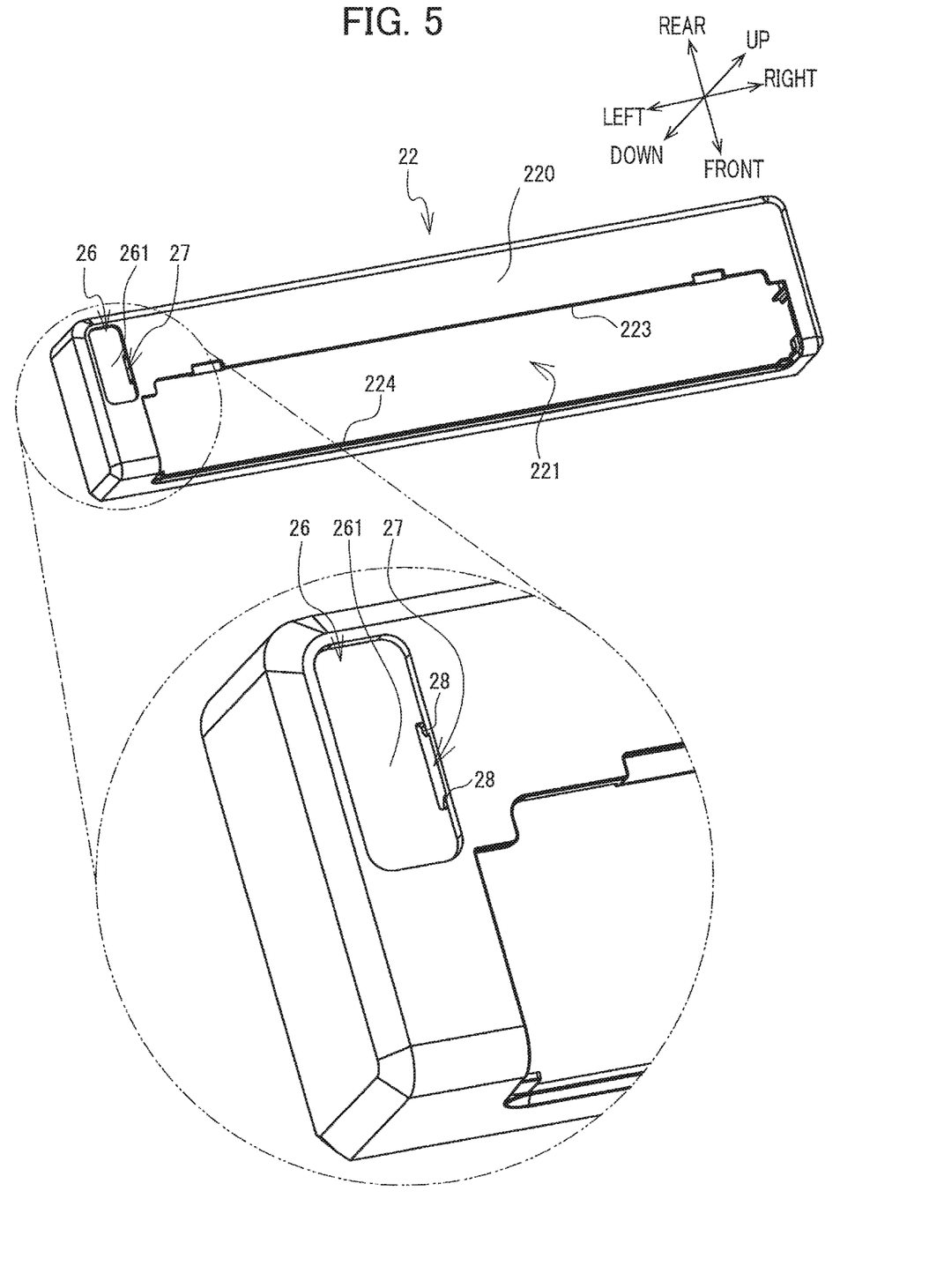
FIG. 5 is a perspective view of an upper cover 22 as viewed from an upper-left side thereof.

As illustrated in FIG. 5, a hole part 27 is formed at a right end portion of the bottom surface 261 of the grooved part 26. The hole part 27 has an elongated shape extending in the front-rear direction in a plan view. Through the hole part 27, the cable part 972 of the FPC 97 is introduced into the casing 2. The hole part 27 has a length in the front-rear direction greater than a length in the front-rear direction (width) of the cable part 972, i.e., the length of the short side of the cable part 972.

Figure 6:
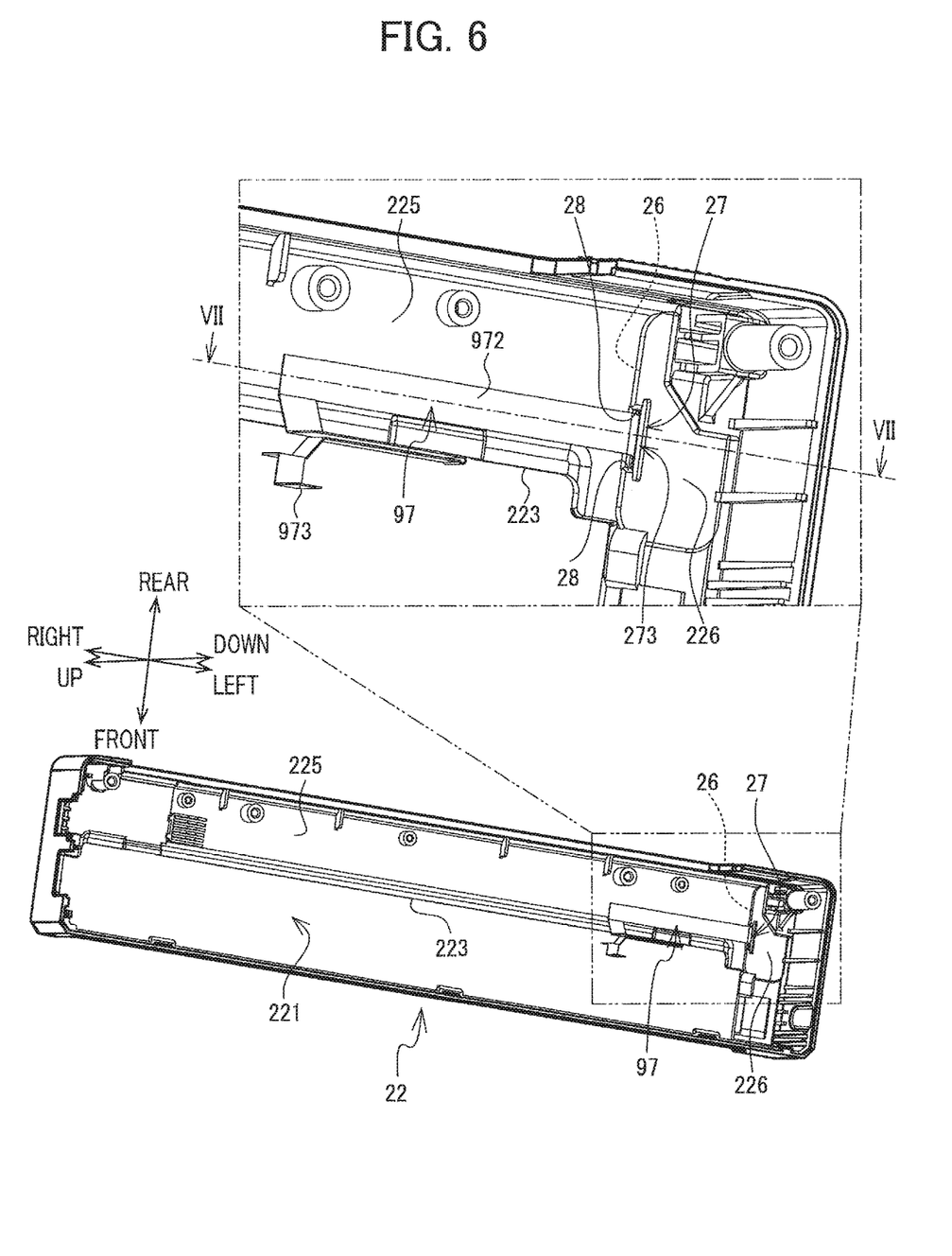
FIG. 6 is a perspective view of the upper cover 22 as viewed from a lower-right side thereof.

As illustrated in FIG. 6, when the upper cover 22 is viewed from below, a groove lower surface 226 is provided on a left end portion of a lower surface 225 of the upper cover 22. The groove lower surface 226 has a substantially rectangular shape elongated in the front-rear direction in a bottom view. The groove lower surface 226 is provided at a position corresponding to the grooved part 26. The groove lower surface 226 protrudes downward from the lower surface 225. A lower opening of the hole part 27 (hereinafter, referred to as "lower opening 273") is formed at a right end portion of the groove lower surface 226.

The controller 9 is positioned diagonally downward and rightward relative to the hole part 27. The cable part 972 passing through the lower opening 273 extends rightward inside the casing 2. Two guide parts 28 are provided at a right end of the lower opening 273. The two guide parts 28 are arranged to oppose each other in the front-rear direction and protrude downward from the lower surface 225 of the upper cover 22. The two guide parts 28 define a gap therebetween in the front-rear direction smaller than a width of a left end of the lower opening 273 in the front-rear direction. That is, by the provision of the two guide parts 28 at the right end of the lower opening 273, the width in the front-rear direction of the lower opening 273 is narrower at the right end than at the left end. The cable part 972 extends rightward between the two guide parts 28 while passing through the lower opening 273. The two guide parts 28 function to restrict the cable part 972 from moving in the front-rear direction and guide the FPC 97 to the controller 9 positioned rightward of the hole part 27. The cable part 972 extends rightward through the guide parts 28 and is then routed frontward to be connected to the controller 9.

<Structure of the Hole Part 27>

Figure 8:
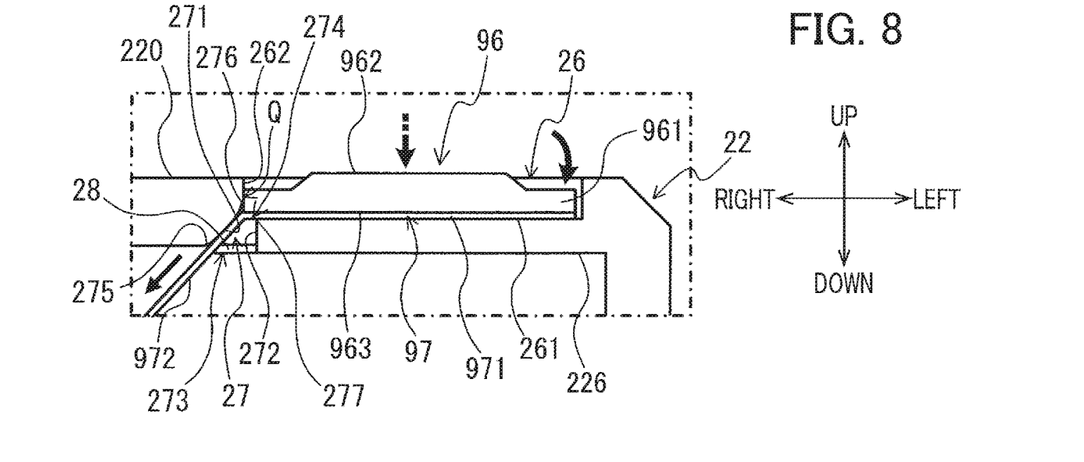
FIG. 8 is an explanatory view for description of assembly of the switch unit 96 to a grooved part 26 of the upper cover 22.
Figure 9:
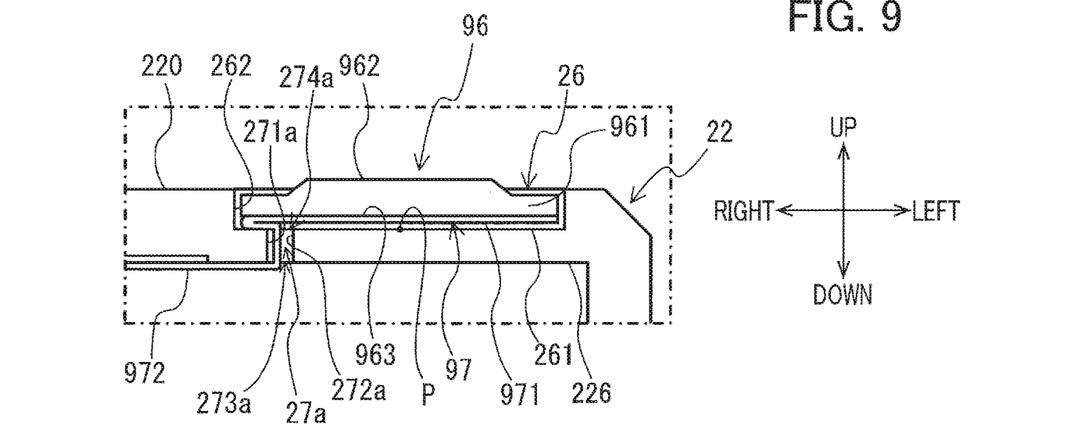
FIG. 9 is a comparative view illustrating assembly of the switch unit 96 to the grooved part 26 provided with a hole part 27a in a conventional printer.
Figure 10:
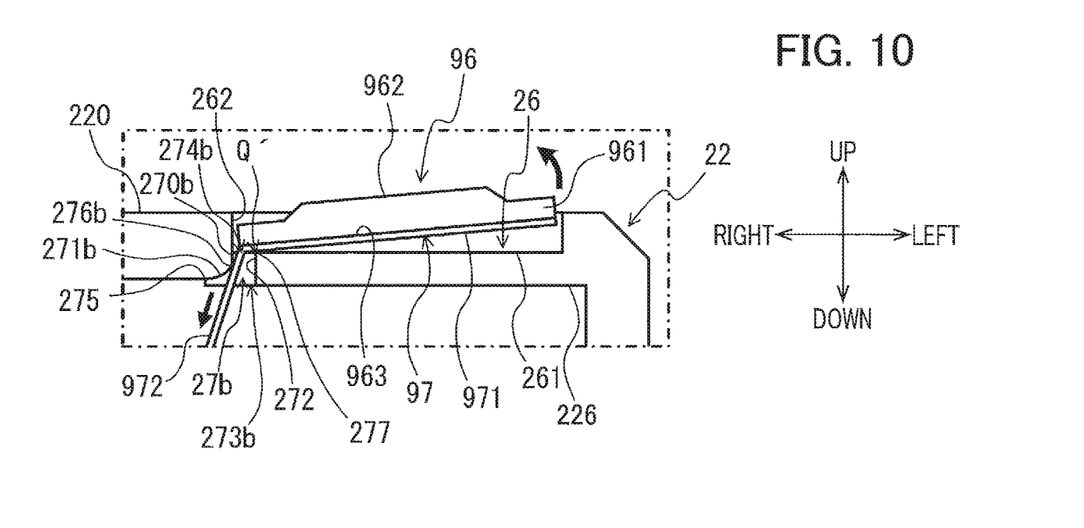
FIG. 10 is another comparative view illustrating assembly of the switch unit 96 to the grooved part 26 provided with a hole part 27b in another conventional printer.

Next, the structure of the hole part 27 will be described in detail with reference to FIGS. 6 to 8. In FIGS. 8 to 10, hatching indicative of cross sections is omitted to improve visibility of the FPC 97.

The lower opening 273 extends from a prescribed position to a right edge of the groove lower surface 226, the prescribed position being slightly leftward relative to the right edge of the groove lower surface 226. The right end of the lower opening 273 is defined by the lower surface 225 and the two guide parts 28.

As illustrated in FIGS. 5 and 7, an upper opening of the hole part 27 (hereinafter, referred to as "upper opening 274") extends from a prescribed position to a lower edge of an inner wall 262 constituting the right end of the grooved part 26, the prescribed position being slightly below a center of the inner wall 262 in the up-down direction. With respect to the left-right direction, the upper opening 274 extends from a prescribed position to a right edge of the bottom surface 261 of the grooved part 26, the prescribed position being slightly leftward of the right edge of the bottom surface 261.

As illustrated in the cross section of FIG. 7 (hereinafter, referred to as "VII-VII cross section"), a tapered part 271 is formed to be connected to the inner wall 262 defining the right end of the grooved part 26. The tapered part 271 constitutes a right end of inner walls constituting the hole part 27 and defines a right edge of the upper opening 274. The tapered part 271 is a sloped surface gradually sloping obliquely downward and rightward from the inner wall 262. The inner walls constituting the hole part 27 also define a left end part 272 extending in the up-down direction. The left end part 272 constitutes a left edge of the upper opening 274. The hole part 27 has a diameter in the left-right direction that becomes greater toward the lower opening 273 from the upper opening 274.

As illustrated in FIGS. 7 and 8, the tapered part 271 is positioned outside (rightward) of the grooved part 26. The tapered part 271 has an upper end (starting point 276) connected to the inner wall 262. The starting point 276 is above the bottom surface 261 of the grooved part 26 in the up-down direction. The tapered part 271 has a lower end (end point 275) connected to the lower surface 225 of the upper cover 22. The end point 275 is formed as a chamfered surface. The upper opening 274 at the left end part 272 is positioned slightly leftward of the right end of the plate part 961.

<Assembly of the Switch Unit 96>

Next, one example of a method to assemble the switch unit 96 to the upper cover 22 will be described with reference to FIG. 8.

The switch connection part 971 of the FPC 97 is connected to the bottom surface 963 of the switch unit 96 in advance. First, a double-sided tape is affixed to the switch connection part 971. The cable part 972 is then inserted and introduced inside the upper cover 22 through the hole part 27.

The bottom surface 963 of the switch unit 96 is then brought close to the bottom surface 261 of the grooved part 26 in a state where the cable part 972 is stretched toward the controller 9. The switch connection part 971 is stuck to the bottom surface 261 through the double-side tape, so that the bottom surface 963 of the switch unit 96 is fixed to the bottom surface 261 of the grooved part 26. In a state where the switch unit 96 is assembled to the grooved part 26, the FPC 97 is routed such that the controller connection part 973 is connected to the controller 9. The controller 9 is positioned downward and rightward of the hole part 27. The cable part 972 is stretched in the state where the switch unit 96 is fixed to the grooved part 26 upon connection of the controller connection part 973 to the controller 9, so that the cable part 972 is applied with a force acting diagonally toward the lower-right.

Functions and Technical Advantages of the Embodiment

In the printer 1 according to the embodiment, the grooved part 26 is formed in the upper surface 220 of the upper cover 22 such that the grooved part 26 is recessed downward from the upper surface 220. The switch unit 96 is disposed in the grooved part 26. The bottom surface 963 of the switch unit 96 is fixed to the bottom surface 261 of the grooved part 26 through the FPC 97. The hole part 27 is formed at the right end portion of the bottom surface 261. The FPC 97 connected to the switch unit 96 is introduced into the interior of the casing 2 through the hole part 27 and is connected to the controller 9 inside the casing 2. The tapered part 271 is positioned outside of (rightward of) the grooved part 26 in the left-right direction. The tapered part 271 is the right end of the inner walls constituting the hole part 27, and is an end defining the right edge of the upper opening 274 of the hole part 27. In other words, the tapered part 271 is an end positioned farther from a center P (see FIG. 7) of the bottom surface 261 in the left-right direction than the left end part 272 (left edge of the upper opening 274) is from the center P in the left-right direction.

Here, in order to facilitate understanding of the technical advantages of the arrangement of the hole part 27 in the printer 1 of the embodiment, a comparative structure will be described with reference to FIG. 9 where a hole part 27a of a conventional printer is illustrated as a comparative example. In FIG. 9, the same parts and components as those of the printer 1 according to the embodiment will be designated with the same reference numerals as those used in the above embodiment.

In the conventional printer, the hole part 27a through which the FPC 97 is inserted is provided at a position deviated to the left from the right end portion of the bottom surface 261 (compared to the configuration of the hole part 27 of the embodiment illustrated in FIG. 8). A right end part 271a of the hole part 27a in the VII-VII cross section is positioned inside the grooved part 26 (leftward of the inner wall 262) in the left-right direction. Each of the right end part 271a and a left end part 272a of the hole part 27a in the VII-VII cross section extends in the up-down direction. A lower opening 273a of the hole part 27a is formed in the groove lower surface 226. An upper opening 274a of the hole part 27a is formed in the bottom surface 261 of the grooved part 26.

In the conventional configuration of FIG. 9, the cable part 972 extending from the switch connection part 971 may be bent leftward by 180 degrees relative to the switch connection part 971, folded between the bottom surface 963 of the switch unit 96 and the bottom surface 261 of the grooved part 26, and then inserted downward through the hole part 27a while being bent downward at the hole part 27a. Further, in the conventional printer of FIG. 9, the hole part 27a is positioned beneath the buttons 962 in the left-right direction. Accordingly, the buttons 962 are dented downward when being pressed (clicked) by a user, thereby possibly causing a portion of the pressed button 962 to enter the hole part 27a. If this is the case, the user does not sense reaction from the bottom surface 261 through the portion of the pressed button 962 in response to clicking of the button 962. As such, the user may feel discomfort with respect to the operation of the buttons 962.

To this effect, as illustrated in FIG. 7, in the printer 1 according to the embodiment, the hole part 27 is provided at the right end portion of the bottom surface 261, and the tapered part 271 (i.e., the right end of the inner walls constituting the hole part 27 in the VII-VII cross section) is positioned outside of the grooved part 26 in the left-right direction. With this structure, the switch unit 96 is restricted from being assembled to the grooved part 26 with the FPC 97 bent and folded by 180 degrees as in the case of the conventional printer illustrated in FIG. 9. Further, in the printer 1 according to the embodiment, the hole part 27 is provided at the right end portion of the bottom surface 261. That is, the hole part 27 is less likely to be positioned below the buttons 962. Accordingly, in the printer 1 according to the embodiment, there is less likelihood that a user may feel uncomfortable when clicking the buttons 962.

Further, in the embodiment, the end point 275 (the lower end of the tapered part 271) connected to the lower surface 225 of the upper cover 22 is chamfered. The end point 275 is a portion which tends to make contact with the FPC 97 upon assembly of the switch unit 96 to the grooved part 26. However, since the end point 275 is chamfered in the printer 1 according to the embodiment, wearing of the surface of the FPC 97 due to the contact thereof with the end point 275 is less likely to occur, thereby restraining occurrence of disconnection in the FPC 97.

Further, the tapered part 271 of the hole part 27 is sloped diagonally downward and rightward from the inner wall 262 (from the upper side of the hole part 27) toward the outside of the grooved part 26. That is, the tapered part 271 is sloped such that the tapered part 271 extends away from the center P of the bottom surface 261 in the left-right direction. This structure can restrain the switch unit 96 from being assembled to the grooved part 26 in a state where the FPC 97 is bent or folded. Thus, in the printer 1 according to the embodiment, occurrence of disconnection at the FPC 97 can be reduced as a result of the wearing of the surface of the FPC 97.

Still further, the starting point 276 (the upper end of the tapered part 271) is positioned above the bottom surface 261. Upon routing of the FPC 97 toward the controller 9 after assembly of the switch unit 96 to the grooved part 26, the cable part 972 is stretched in a state where the switch unit 96 is fixed to the grooved part 26.

Here, in order to facilitate understanding of the technical advantages of the arrangement of the hole part 27 in the printer 1 of the embodiment, another comparative structure will be described with reference to FIG. 10 where a hole part 27b of another conventional printer is illustrated as another comparative example. In FIG. 10, the same parts and components as those of the printer 1 according to the embodiment will be designated with the same reference numerals as those used in the above embodiment.

As illustrated in FIG. 10, the right end portion of the hole part 27b in the VII-VII cross section is constituted by an upper part 270b and a tapered part 271b. The upper part 270b extends downward from an upper opening 274b of the hole part 27b. The tapered part 271b is positioned below the upper part 270b. The tapered part 271b is curved downward and rightward from the lower end of the upper part 270b to provide a starting point 276b (the upper end of the tapered part 271b) and an end point 275b (the lower end of the tapered part 271b). That is, in the hole part 27b, the starting point 276b is positioned below the bottom surface 261, unlike the starting point 276 of the tapered part 271 of the hole part 27 in the depicted embodiment.

In the hole part 27b of the conventional printer illustrated in FIG. 10, the bottom surface 963 of the switch unit 96 is fixed to the bottom surface 261 of the grooved part 26 through the switch connection part 971. The cable part 972 is routed toward the controller 9. At this time, the cable part 972 tends to make contact with a corner part 277 constituting an upper end of the left end part 272. Accordingly, when the cable part 972 is stretched toward the controller 9 while making contact with the corner part 277, the cable part 972 may be applied with a force acting diagonally downward and rightward as indicated by a bold downward arrow in FIG. 10. Thus, in the conventional printer of FIG. 10, the cable part 972 may be pressed against the corner part 277 upon assembly of the switch unit 96 to cause surface wearing of the cable part 972, which may result in occurrence of disconnection at the cable part 972 of the FPC 97. Further, in the structure of FIG. 10, due to the application of the downward force to the cable part 972, the switch unit 96 may be applied with a force acting in such a direction that the left end portion of the switch unit 96 is lifted upward about the corner part 277 serving as a pivot center Q'. As such, there is a possibility that the fixing of the switch unit 96 to the grooved part 26 by the double-sided tape may be released.

To this effect, as illustrated in FIG. 8, in the printer 1 according to the embodiment, the starting point 276 is positioned above the bottom surface 261. Accordingly, the cable part 972, which is being stretched toward the controller 9 through the hole part 27, is applied with a force acting in a direction more horizontally toward the right than the force applied to the cable part 972 which is being stretched through the hole part 27b in the configuration of FIG. 10. Thus, the cable part 972 penetrating through the hole part 27 of the embodiment is less likely to be bent than the cable part 972 penetrating through the hole part 27b of the conventional printer illustrated in FIG. 10.

Further, in the configuration of the embodiment illustrated in FIG. 8, the switch unit 96 is applied with a force acting more horizontally toward the right, the right end of the switch unit 96 is brought into contact with the inner wall 262. Since the starting point 276 is positioned above the bottom surface 261, the switch unit 96 is applied with a force acting in such a direction that the left end portion of the switch unit 96 is pressed downward against the bottom surface 261 about a pivot center Q which is the point of contact between the switch unit 96 and the inner wall 262 (see a downward bold arrow in FIG. 8). With this arrangement of the embodiment, the fixing of the switch unit 96 to the grooved part 26 by the double-sided tape is less likely to be released, compared to the conventional arrangement of FIG. 10.

Further, in the above-escribed embodiment, the guide parts 28 are provided respectively on the front and rear sides of the lower opening 273 of the hole part 27, as illustrated in FIG. 6. The guide parts 28 function to restrict deviation of the cable part 972 with respect to the front-rear direction and guide the FPC 97 toward the controller 9. Since the guide parts 28 can guide the FPC 97 to the controller 9, deformation or bending of the FPC 97 can be restrained from occurring. As such, in the printer 1 according to the embodiment, disconnection of the FPC 97 attributed to bending of the FPC 97 is hard to occur.

<Modifications>

While the invention has been described in conjunction with various example structures outlined above and illustrated in the figures, various alternatives, modifications, variations, improvements, and/or substantial equivalents, whether known or that may be presently unforeseen, may become apparent to those having at least ordinary skill in the art. Accordingly, the example embodiments of the disclosure, as set forth above, are intended to be illustrative of the invention, and not limiting the invention. Various changes may be made without departing from the spirit and scope of the disclosure. Therefore, the disclosure is intended to embrace all known or later developed alternatives, modifications, variations, improvements, and/or substantial equivalents. Some specific examples of potential alternatives, modifications, or variations in the described invention are provided below:

In the VII-VII cross section, the tapered part 271 is positioned outside of (rightward of) the grooved part 26 in the left-right direction in the embodiment. However, the position of the tapered part 271 in the left-right direction may be the same as the position of the inner wall 262 in the left-right direction. In this case, the inner wall 262 and tapered part 271 extend in the up-down direction so as to be continuous with each other in the front-rear direction.

Further, as in the above modification, the tapered part 271 may not necessarily be sloped to extend away from the center P of the bottom surface 261. Alternatively, for example, the tapered part 271 may extend in the up-down direction, or may be sloped to extend toward the center P of the bottom surface 261 (i.e., leftward) in the left-right direction.

Still further, while the left end part 272 of the hole part 27 extends in the up-down direction in the above embodiment, the left end part 272 may be sloped to extend toward or away from the center P of the bottom surface 261 in the left-right direction. Still further, the hole part 27 need not widen its diameter from the upper opening 274 toward the lower opening 273, and may reduce its diameter toward the lower opening 273, for example.

In the above-described embodiment, the hole part 27 is provided at the right end portion of the bottom surface 261. However, the hole part 27 may be provided at an end portion of the bottom surface 261 different from the right end portion thereof. In this case, in a cross-sectional view including the grooved part 26, hole part 27, and switch unit 96 (just like the VII-VII cross section of the embodiment), the tapered part 271 is the end of the inner walls of the hole part 27 on the far side from the center P (see FIG. 7) of the bottom surface 261 (relative to the end corresponding to the left end part 272).

Further, the starting point 276 (upper end of the tapered part 271) need not be positioned above the bottom surface 261. Alternatively, for example, the starting point 276 may be at the same position as the bottom surface 261 in the up-down direction.

Further, the tapered part 271 need not be sloped gradually rightward as a whole. Alternatively, for example, only a portion of the tapered part 271 near the end point 275 may be formed to be sloped gradually and chamfered.

The guide parts 28 may have an arbitrary shape, provided that the guide parts 28 can guide the FPC 97 toward the controller 9. For example, an arch-like member may be provided inside the upper cover 22 such that the FPC 97 extends through the arch-like member toward the controller 9.

While an entirety of the switch unit 96 is disposed inside the grooved part 26 in the embodiment, the switch unit 96 as a whole need not be positioned inside the grooved part 26 and at least the bottom surface 963 may be disposed inside the grooved part 26. For example, the switch unit 96 may have a mushroom-like shape in the VII-VII cross section, and an upper end portion of the mushroom-shaped switch unit 96 may be positioned outside the grooved part 26 to protrude outward therefrom.

In the above embodiment, the switch unit 96 is a so-called membrane switch, and the buttons 962 are configured to be dented by user's depression to render the contacts of the switch connection part 971 on. However, the switch unit 96 may be a switch other than the membrane switch, such as a limit switch, provided that the switch unit 96 is connected to the FPC 97. Still further, the FPC 97 may be configured to transmit signals other than the ON/OFF signals indicative of ON and OFF of the contacts. For example, the FPC 97 may transmit signals from the controller 9 to the switch unit 96. As an example, the controller 9 may transmit a signal to the switch unit 96 through the FPC 97 when the battery 10 is undercharged, so that an LED provided in one of the buttons 962 can be turned on.

REMARKS

The printer 1 is an example of a printer. The casing 2 is an example of a casing. The grooved part 26 is an example of a grooved part. The bottom surface 261 is an example of a groove bottom surface. The inner wall 262 is an example of a groove inner wall. The right end portion of the bottom surface 261 is an example of a prescribed end portion of the groove bottom surface. The controller 9 is an example of a controller. The switch unit 96 is an example of a switch unit. The bottom surface 963 is an example of a switch bottom surface. The FPC 97 is an example of a flexible printed circuit. The hole part 27 is an example of a hole part. The tapered part 271 is an example of a first inner end. The left end part 272 is an example of a second inner end. The guide parts 28 are an example of a guide part. The left-right direction is an example of a prescribed direction. The upper opening 274 is an example of an upper opening of the hole part, and the lower opening 273 is an example of a lower opening of the hole part.

What is claimed is:

1. A printer comprising:
   a casing;
   a grooved part in a form of a recess formed on an outer surface of the casing, the grooved part having a groove bottom surface and a groove inner wall, the groove bottom surface having a prescribed end portion from which the groove inner wall extends;
   a switch unit provided in the grooved part, the switch unit having a switch bottom surface;
   a controller disposed inside the casing;
   a flexible printed circuit having a first end connected to the switch bottom surface and a second end connected to the controller; and
   a hole part formed at the prescribed end portion of the groove bottom surface, the flexible printed circuit extending through the hole part to be introduced inside the casing, the groove bottom surface defining a center thereof in a prescribed direction and the center and the hole part being aligned with each other in the prescribed direction, the hole part having inner walls defining a first inner end and a second inner end opposing each other in the prescribed direction, the first inner end being farther away from the center of the groove bottom surface than the second inner end is from the center of the groove bottom surface in the prescribed direction,
   wherein the switch bottom surface is fixed to the groove bottom surface through the flexible printed circuit, and
   wherein the first inner end is positioned outside of the grooved part in the prescribed direction or at the same position as the groove inner wall in the prescribed direction.

2. The printer according to claim 1, wherein the first inner end is connected to an inner surface of the casing such that a portion connecting therebetween is chamfered.

3. The printer according to claim 1, wherein the first inner end is sloped such that the first inner end extends downward and away from the center of the groove bottom surface in the prescribed direction.

4. The printer according to claim 1, wherein the first inner end has an upper end positioned above the groove bottom surface.

5. The printer according to claim 1, wherein the casing comprises a guide part configured to guide the flexible printed circuit toward the controller, the guide part being provided at an inner surface of the casing.

6. The printer according to claim 5, wherein the guide part is a pair of protrusions protruding downward from the inner surface of the casing and arranged near the hole part to oppose each other in a direction orthogonal to the prescribed direction.

7. The printer according to claim 1, wherein the second inner end extends vertically.

8. The printer according to claim 1, wherein the hole part has an upper opening and a lower opening, the upper opening being open at the prescribed end portion of the groove bottom surface, the lower opening being open at an inner surface of the casing, and
   wherein the hole part defines a diameter that becomes greater toward the lower opening from the upper opening.

* * * * *